(12) United States Patent
Mandia et al.

(10) Patent No.: US 11,773,488 B2
(45) Date of Patent: Oct. 3, 2023

(54) METHODS FOR LOW-TEMPERATURE P-CVD AND THERMAL ALD OF MAGNESIUM DIBORIDE

(71) Applicant: UCHICAGO ARGONNE, LLC, Chicago, IL (US)

(72) Inventors: David Joseph Mandia, Chicago, IL (US); Angel Yanguas-Gil, Northbrook, IL (US); Devika Choudhury, Naperville, IL (US); Aliraeza Nassiri, Woodridge, IL (US); Anil U. Mane, Naperville, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 795 days.

(21) Appl. No.: 16/426,994

(22) Filed: May 30, 2019

(65) Prior Publication Data
US 2020/0378003 A1  Dec. 3, 2020

(51) Int. Cl.
C23C 16/455 (2006.01)
C23C 16/38 (2006.01)
C23C 16/56 (2006.01)

(52) U.S. Cl.
CPC ........ *C23C 16/45553* (2013.01); *C23C 16/38* (2013.01); *C23C 16/56* (2013.01)

(58) Field of Classification Search
CPC .............. C23C 16/38; C23C 16/45525; C23C 16/45553; C23C 16/403; C23C 16/56
See application file for complete search history.

(56) References Cited

U.S. PATENT DOCUMENTS

| | | | |
|---|---|---|---|
| 8,362,220 B2 | 1/2013 | Girolami et al. | |
| 8,463,342 B2 | 6/2013 | Norem et al. | |
| 2004/0043149 A1* | 3/2004 | Gordon | H01L 29/0684 427/255.31 |
| 2004/0124131 A1* | 7/2004 | Aitchison | C23C 16/45544 210/252 |
| 2010/0168404 A1* | 7/2010 | Girolami | C07F 19/005 534/15 |
| 2017/0130330 A1* | 5/2017 | Nardi | C23C 16/403 |
| 2017/0166456 A1* | 6/2017 | Darling | B01J 20/3291 |
| 2019/0062915 A1* | 2/2019 | Mane | C23C 16/4408 |

OTHER PUBLICATIONS

Alarco, et al., "Phonon modes of MgB2: super-lattice structures and spectral response," Physical Chemistry Chemical Physics 16, pp. 24443-24456 (2014).

(Continued)

*Primary Examiner* — Elizabeth A Burkhart
(74) *Attorney, Agent, or Firm* — Foley & Lardner LLP (57) ABSTRACT

ALD and p-CVD methods to generate $MgB_2$ and $MgB_2$-containing films in the growth temperature range of 250-300° C. The thermal ALD and p-CVD methods shown herein ensure that the high-temperature-induced roughening, which causes high surface resistances in $MgB_2$ coatings grown by the mentioned conventional techniques, is avoided. The $MgB_2$ and $MgB_2$-containing films exhibit superconductive properties at above 20° K.

14 Claims, 7 Drawing Sheets

(56) References Cited

OTHER PUBLICATIONS

Aswal, et al., "Degradation behavior of MgB2 superconductor," Physica C: Superconductivity 363(3), pp. 208-214 (2001).
Burton, et al., "Atomic Layer Deposition of MgO Using Bis(ethylcyclopentadienyl)magnesium and H2O," Journal of Physical Chemistry C 113(5), pp. 1939-1946 (2009).
Buzea & Yamashita, "Review of the superconducting properties of MgB2," Superconductor Science and Technology 14(11), R115, 35 pages (2001).
Elam, et al., "Viscous flow reactor with quartz crystal microbalance for thin film growth by atomic layer deposition," Review of Scientific Instruments 73, 2981, 7 pages (2002).
Garcia-Alonso, et al., "Atomic layer deposition of B-doped ZnO using triisopropyl borate as the boron precursor and comparison with Al-doped ZnO," Journal of Materials Chemistry C 3, pp. 3095-3107 (2015).
Guritanu, et al., "Anisotropic optical conductivity and two colors of MgB2," Physical Review B 73, 104509, 11 pages (2006).
Lee, et al., "Hybrid Physical Chemical Vapor Deposition of Magnesium Diboride Inside 3.9 GHz Mock Cavities," IEEE Transactions on Applied Superconductivity 27(4), 3500304, 4 pages (2017).
Mackinnon, et al., "Synthesis of MgB2 at Low Temperature and Autogenous Pressure," Materials 7(5), pp. 3901-3918 (2014).
Nagamatsu, et al., "Superconductivity at 39K in magnesium diboride," Nature 410, pp. 63-64 (2001).
Pogrebnyakov, et al., "CVD-based approach to the growth of epitaxial MgB2 thin films," Condensed Matter: Superconductivity, 14 pages (2002).
Simpson, et al., "XPS investigation of monatomic and cluster argon ion sputtering of tantalum pentoxide," Applied Surface Science 405, pp. 79-87 (2017).

Vasquez, et al., "X-ray photoemission study of MgB2," Physical Review B 64, 052510, 19 pages (2001).
Ishihara, et al., "Superior homogeneity of trapped magnetic field in superconducting MgB2 bulk magnets," Superconductor Science and Technology 30(3), 035006, 6 pages (2017).
Kim & Girolami, "Highly Volatile Magnesium Complexes with the Aminodiboranate Anion, a New Chelating Borohydride. Synthesis and Characterization of Mg(H3BNMe2BH3)2 and Related Compounds," Inorganic Chemistry 49(11), pp. 4942-4948 (2010).
Kim, et al., "Atomic layer deposition of B2O3/SiO2 thin films and their application in an efficient diffusion doping process," Journal of Materials Chemistry C 2, pp. 5805-5811 (2014).
Nassiri, et al., "Cryogen-free Rf System Studies Using Cryocooler-cooled Magnesium Diboride-coated Copper Rf Cavities," Proceedings of the 16th International Conference on RF Superconductivity, pp. 663-665 (2013).
Oates, et al., "Microwave measurements of MgB2: implications for applications and order-parameter symmetry," Superconductor Science and Technology 23(3), 034011, 6 pages (2010).
Putkonen, et al., "Enhanced growth rate in atomic layer epitaxy deposition of magnesium oxide thin films," Journal of Materials Chemistry 10, pp. 1857-1861 (2000).
Wang, et al., "Highly conformal magnesium oxide thin films by low-temperature chemical vapor deposition from Mg(H3BNMe2BH3)2 and water," Applied Physics Letters 102, 101605, 4 pages (2013).
Yang, et al., "In-situ growth of superconducting MgB2 thin films by HPCVD method at low temperature," Physica C: Superconductivity and its Applications 467 (1-2), pp. 1-3 (2007).
Zhang, et al., "Superconducting MgB2 film prepared by chemical vapor deposition at atmospheric pressure of N2," Thin Solid Films 584, pp. 300-304 (2015).

* cited by examiner

METHODS FOR LOW-TEMPERATURE P-CVD AND THERMAL ALD OF MAGNESIUM DIBORIDE

STATEMENT OF GOVERNMENT SUPPORT

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to superconductive materials. More particularly, the present disclosure relates to systems and methods for formation of magnesium diboride.

BACKGROUND

Discovered in 2001, magnesium diboride ($MgB_2$) is a binary superconducting material with a relatively high critical temperature ("Tc") of ~39° K and very interesting properties as a bulk, high-field permanent magnet. $MgB_2$ is an exciting material due to its high $T_c$, very simple crystalline structure, and very high critical current densities (~2.6× $10^6$ Å/cm$^2$ and higher). New superconducting materials, such as $MgB_2$, will play a critical role as viable substitutes to niobium (Nb)-based superconductors, such as niobium-tin ($Nb_3Sn$), which has a $T_c$ that is highly contingent upon low grain boundary concentration and exact stoichiometric control. Enhancement of radiofrequency ("RF") performance by bulk $MgB_2$ grown on copper or niobium-based resonant structures, such as superconducting radiofrequency ("SRF") accelerator cavities, is a primary application for the $MgB_2$ thin films.

Despite its simple binary composition, synthesis of uniform and conformal $MgB_2$ films on high aspect ratio features, such as complex SRF architectures and powders, remains non-trivial and elusive. While line-of-sight methods, such as hybrid physical chemical vapor deposition ("HPCVD"), have shown success on the wafer/coupon scale, the temperature requirements (700° C. or greater) and precursors required (e.g., diborane ($B_2H_6$) has a fatal toxicity greater than 40 ppm and is explosive at 9000 ppm) warrant research into alternative fabrication methods that are safer and with more stoichiometric control.

SUMMARY

At least one embodiment relates to a method for forming a $MgB_2$ containing film. The method comprises depositing a coating on a substrate via layer atomic layer deposition by X, where X is greater than 0, cycles. The ALD cycles comprise: pulsing a first precursor comprising Bis(cyclopentadienyl) Magnesium (II) ($Mg(Cp)_2$) at a first deposition temperature; purging the first precursor; pulsing a second precursor comprising an oxidizer of the first precursor at a second deposition temperature; purging the second precursor; and pulsing a third precursor comprising Trimethyl borate ($B(OCH_3)_3$ at a third deposition temperature, annealing the deposited coating in a reducing environment to remove oxygen from the film.

Another embodiment relates to a method for forming a $MgB_2$ containing film. The method comprises depositing a coating on a substrate via layer chemical vapor deposition. The CVD proceeds by reacting a vaporous first precursor selected from the group consisting of Bis(N,N-dimethyl-diboranamido)magnesium(II) ($Mg(H_3BNMe_2BH_3)_2$) and $Mg(DMADB)_2$), forming solid $MgB_2$ on the substrate, and applying a purge with ultra-high purity inert gas, removing the first precursor.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

FIGS. 6A and 6C show XPS depth profile analysis of as-deposited $MgB_2$ film (290° C.) by Method 2 on TiN (150 nm on Si(100) substrate) (FIG. 6A) and directly on Si(100) (FIG. 6C) with corresponding high-resolution Mg 1 s/B 1 s XPS data shown in panels FIGS. 6B and 6D, wherein the HR-XPS spectra is sampled from a bulk-like region of the film (i.e., after ~30 s of Ar$^+$ sputtering; dashed line in FIG. 6A). Note: depth-resolved HR-XPS B 1 s spectra after 150 s of etching were filtered such that any contribution <186 eV was due to the emerging Si 2 s plasmon loss feature from the Si(100) substrate (denoted by "*" in FIG. 6C) and not from residual $MgB_2$. Film thickness was confirmed to be ~13 nm by SE.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Studies indicate that the $MgB_2$ p-CVD growth is more uniform over conducting surfaces, such as copper and titanium nitride (TiN), which is ideal given the intended substrates for the $MgB_2$ coatings, which are copper and metal nitride-coated RF cavities. Because the mentioned harsh environmental conditions (T>500° C., use of pure $H_2$, $B_2H_6$, etc.) for $MgB_2$ are avoided by the low-temperature ALD and p-CVD techniques—and with the cycle-to-cycle programmatic control inherent to the techniques—stoichiometrically pure and highly uniform $MgB_2$ coatings with superconducting properties are obtained.

Figure 1:
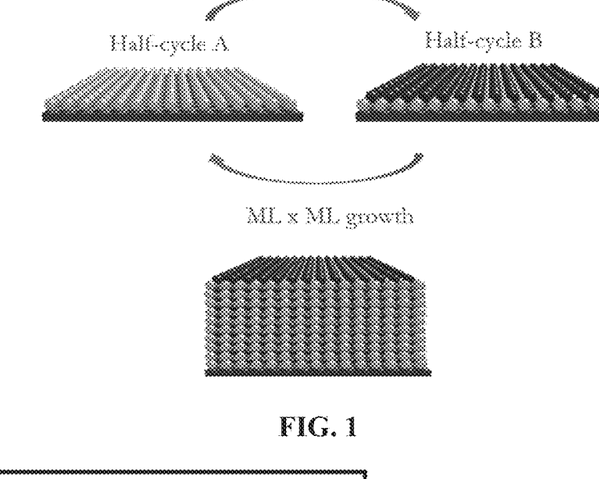
FIG. 1 is a generic schematic demonstrating the layer-by-layer growth process of an AB-type atomic layer deposition ("ALD"). ALD half-cycle surface reactions for precursors A and B are self-limiting and separated by purge steps (arrows), wherein an inert carrier gas removes the gaseous surface reaction byproducts.

This results described herein are believed to be the first successful ALD and p-CVD methods to generate $MgB_2$ and $MgB_2$-containing films in the growth temperature range of 250-300° C., which is very low temperature by comparison to conventional synthetic approaches like HPCVD or magnesium vapor infiltration process. The thermal ALD and p-CVD methods shown herein ensure that the high-temperature-induced roughening, which causes high surface resistances in $MgB_2$ coatings grown by the mentioned conventional techniques, is avoided. FIG. 1 depicts one embodiment of a general schematic of the layer-by-layer process for ALD, which is comprised by exposure of the substrate to the first precursor (half-cycle A), a purge step to remove gaseous byproducts, followed by an exposure of the substrate to the second precursor (half-cycle B), and a subsequent purge step using carrier gas (UHP Ar or $N_2$). Herein, we present two different methods (at T<300° C.) to generate $MgB_2$ films and/or $MgB_2$-containing films on custom viscous flow ALD reactors (as known, not illustrated). One type of flow reactor used may be based upon those described in *Viscous flow reactor with quartz crystal microbalance for thin film growth by atomic layer deposition*, Review of Scientific Instruments 73, 2981 (2002). Described herein are a first embodiment and a second embodiment, relating to the formation of $MgB_2$ materials.

In the first embodiment (Method 1), thermal ALD of Bis(cyclopentadienyl) Magnesium (II) $(Mg(Cp)_2)$-Water-Trimethyl borate $(B(OCH_3)_3$ ("TMB")) with intermittent purge cycles using UHP $N_2$. The water may be replaced with any suitable oxidizer for removal of the Cp ligand from the first precursor. The UHP purge can use $N_2$, or Ar can be used with no effect in terms of N impurities in the resultant films. In plasma-enhanced processes, atomic nitrogen (N instead of $N_2$) could potentially dope the films, thereby inducing N-based impurities in the films The ALD reaction takes place at a reaction temperature in the range of 125-250° C. with one implementation having an optimal growth temperature of 200° C. In general, temperatures in that range show consistent growth that is isothermal (with lower growth rate and thickness at higher T due to desorption of surface species and high surface diffusion). In one particular implementation, the $Mg(Cp)_2$ bubbler temperature was 80° C. and the TMB was volatilized under its own vapor pressure at RT (using a 50 μm orifice installed on the bubbler dose valve). In one embodiment, bubbler temperatures of >70° C. for $Mg(Cp)_2$, such as 80° C., are required to volatilize the precursor. Due to the TMB vapor pressure being quite high, the orifice is used here for precursor preservation (similar to using of the 100 μm orifice on the $Mg(DMADB)_2$ bubbler in Method 2). Since the films are an intimate mixture of $~MgB_{1.05}O_2$ approximate stoichiometry for various thicknesses, the bulk superconductivity properties should not vary. Therefore the high O content hinders the $T_c$ value, notwithstanding the thickness.

Typical ALD processes employed for the synthesis of binary metal oxide films, such as MgO or $Al_2O_3$ are of the "AB" type, where "A" is the metal-containing precursor (e.g., trimethyl aluminum ("TMA")) and "B" is the co-reactant precursor which contains the heteroatom (e.g., $H_2O$) of the target film (e.g., $Al_2O_3$). Method 1, however, involves an ABC-type of super-cycle wherein the AB sub-cycle is an established ALD approach to generating amorphous MgO films, but with the third half-cycle "C" employing TMB as the B source. The ALD pulse sequence (in seconds) is $t_1$-$t_2$-$t_3$-$t_4$-$t_5$-$t_6$, where $t_1$ is $Mg(Cp)_2$ with a time of 0.75 to 5 seconds, $t_3$ is $H_2O$ with a time of 0.5 to 5 seconds, and $t_5$ is $B(OCH_3)_3$ with a time of 0.5 to 1, respectively, with intermittent ($t_{2,4,6}$) UHP $N_2$ purge times of 10 to 30 seconds. If the purge time is >10 seconds after any precursor dose, this is known to be sufficient (leading to self-limiting surface reactions) for many metal oxide ALD processes on these reactors. In one particular implementation, which is utilized in the example results below, the precursor pulse times are 1.5-10-1-10-1-10 with purge time of 10 s. In an exemplary embodiment, partial pressures of the $Mg(Cp)_2$ and TMB pulses are ~20 mTorr and the $H_2O$ is ~100 mTorr (plus the background pressure, $P_{total}$, which is ~1 Torr). Bypass (virtual) valving is installed such that the reactor is purging whenever the bubbler dose valves are closed (not pulsing). This means the purge pressures are effectively the background pressure of the reactor (1 Torr).

Figure 2A:
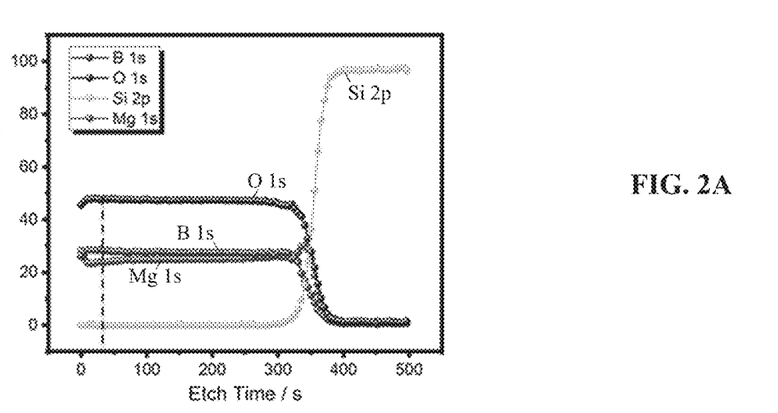
FIG. 2A is an X-ray photoelectron spectroscopy ("XPS") depth profile analysis of as-deposited film (1000 cycles; 200° C.) from Method 1; corresponding high-resolution XPS data is shown in FIG. 2B, where the top panel is the Mg 1 s/B 1 s spectra for the a bulk-like region of the film (i.e., after ~30 s of Ar$^+$ sputtering; dashed line in FIG. 2A) and the bottom panel is the Mg 1 s/B 1 s XPS spectra for a $MgB_2$ powder reference.
Figure 2B:
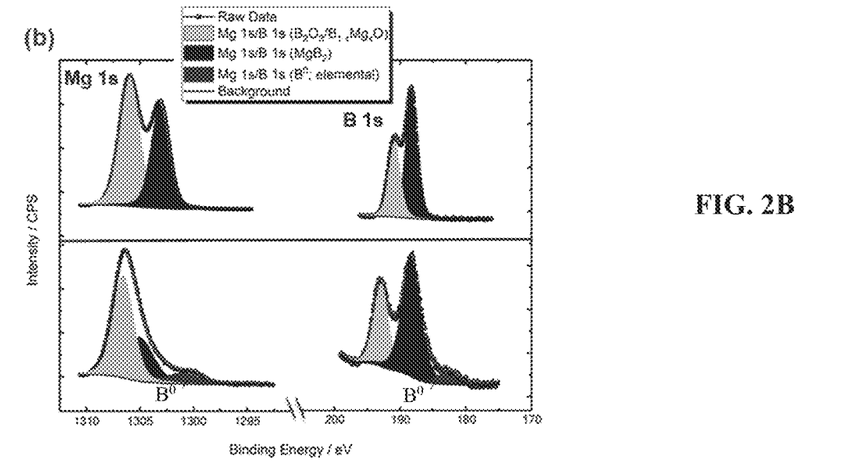

FIG. 2A depict the depth profiling and high-resolution X-ray photoelectron spectroscopy ("HR-XPS") analysis of the as-deposited films grown from Method 1. FIG. 2B (top panel) displays the Mg 1 s and B 1 s HR-XPS regions from the bulk of the film obtained after ~30 s of etching using Ar⁺ bombardment (3 keV voltage; effective etch rate ~2.5 nm/cycle, where 1 cycle is 5 s of sputtering). The $Mg_xB_yO_z$ film composition is relatively homogeneous throughout the depth profiling with an average stoichiometry corresponding to $MgB_{1.05}O_2$. The impact of any oxygen content dwarfs the contribution of any pure $MgB_2$. The high concentration of oxygen in the films can be attributed to the use of oxygen-containing $H_2O$ and $B(OCH_3)_3$ precursors in the ALD process; however, two well separated contributions in the B 1 s HR-XPS spectra at ~192 eV and 187.5 eV, which correspond to $B_2O_3$ and $MgB_2$, respectively. The fittings shaded in green (FIG. 2B) correspond to oxidized $MgB_2$, which is referred to as $B_{1-x}Mg_xO$ in this work, with B effectively acting as the dopant atom. The 0.95 Mg/B ratio (overall $Mg_{1.05}O_2$ stoichiometry) implies that the $MgB_2$ is substoichiometric, which is attributed to the relatively high concentration of oxygen in the films. The $MgB_2$ powder (FIG. 2B, bottom panel) had a high concentration of oxidized $MgB_2$ (mostly as $Mg(OH)_2$ and MgO species) due to the high surface area of the powder and its exposure to ambient conditions prior to XPS analysis. The presence of elemental B in the powder sample also corroborates the formation of $Mg(OH)_2$ species due to $MgB_2$ decomposition after prolonged ambient exposure at room temperature. In one embodiment, the resultant film from Method 1 can undergo annealing treatment in a reducing atmosphere. This annealing effectively drives down the O concentration in the films, rendering a more stoichiometric $MgB_2$ phase. Attempts to reduce the oxygen concentration using pure (100%) $H_2$ plasma for 1 h at 500° C. yielded general surface stoichiometry of $MgB_{1.05}C_{0.02}Si_{0.58}O_4$ by XPS (not shown). The increase in relative oxygen concentration is due to the high vapor pressure of Mg at T>450° C. Removal of Mg from the film in this annealing environment did not significantly improve the Mg/B stoichiometry. Careful annealing studies below 450° C. in $H_2$ plasma or thermally should effectively drive down the oxygen concentration without removing Mg from the layer.

Figure 3A:
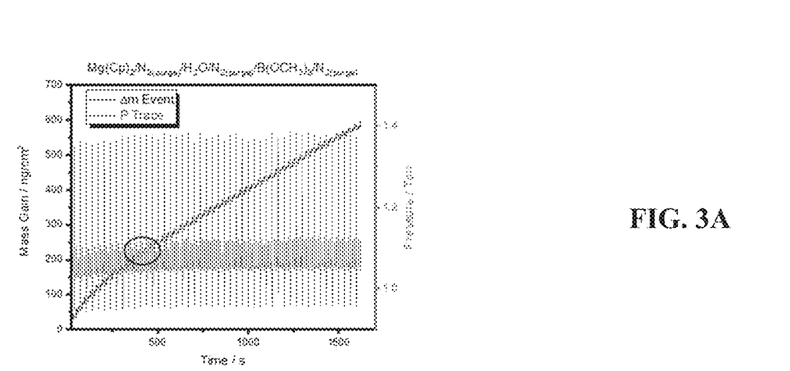
FIGS. 3A-3E show quartz crystal microbalance ("QCM") monitoring for: Method 1 ABC-type ALD process ($Mg(Cp)_2$-$H_2O$—$B(OCH_3)_3$) (FIG. 3A), with corresponding zoomed view of 3 ABC cycles (FIG. 3B), AB cycles for MgO growth ($Mg(Cp)_2$-$H_2O$) (FIG. 3C), BC cycles for $B_2O_3$ growth ($B(OCH_3)_3$—$H_2O$) (FIG. 3D), and AC cycles ($Mg(Cp)_2$-$B(OCH_3)_3$) (FIG. 3E).
Figure 3B:
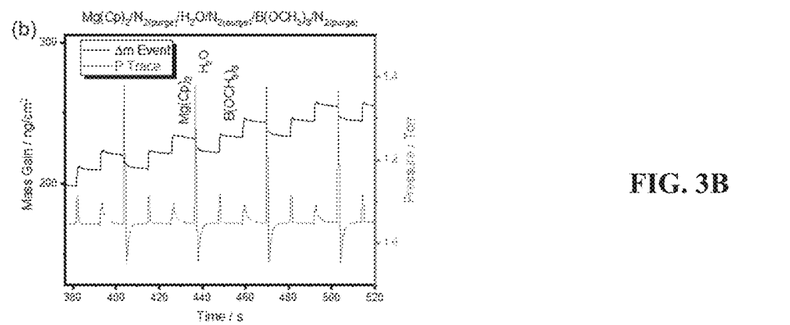
Figure 3C:
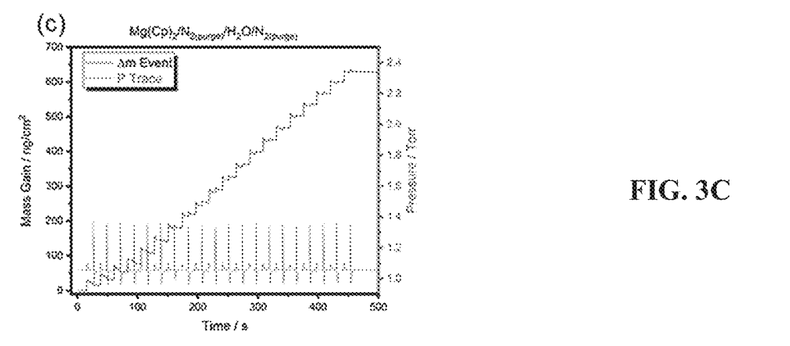
Figure 3D:
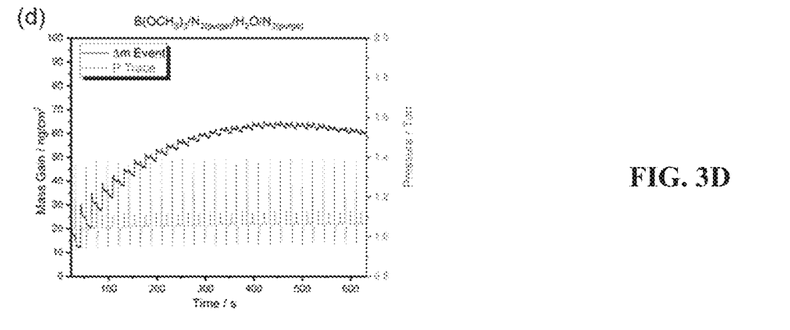

FIGS. 3A-3E exhibit in-situ QCM data collected in order to understand the surface chemistry of the Method 1 and verify the self-limiting (saturating) nature of the individual ALD half-cycles. FIG. 3A shows the linear growth of the $B_{1-x}Mg_xO$ films after alternating exposures of $Mg(Cp)_2$, $H_2O$, and $B(OCH_3)_3$ at 200° C. for ~50 ABC-type ALD cycles. Looking at the zoomed view over the course of 3 ABC cycles (FIG. 3B), there is an initial sharp mass gain per cycle ("MGPC") of ~14.4 ng/cm² after the $Mg(Cp)_2$ dose, followed by a sharp mass loss event of ~8.1 ng/cm² after the $H_2O$, with a final mass gain of ~12 ng/cm² after the $B(OCH_3)_3$ dose. The sharp mass gains and losses observed within each ALD half-cycle demonstrates efficient surface chemistry that reaches completion quickly. The overall MGPC corresponding to 1 ALD cycle was 18.3 ng/cm², and based on the bulk density of $B_2O_3$ (2.46 g/cm³), this approximately corresponds to a growth per cycle (GPC) of ~0.74 Å. As shown in FIG. 3D, precursor dosing of $B(OCH_3)_3$ and $H_2O$ (without $Mg(Cp)_2$) resulted in initial non-linear mass gain during the first 15 BC cycles and non-growth thereafter, which is related to formation of volatile $H_3BO_3$. In fact, at around 24 BC cycles (~550 s), overall mass loss begins to occur, which possibly indicates the onset of etching of the $B_2O_3$ films formed in the first 15 BC cycles.

FIG. 3C shows the linear growth behavior for $Mg(Cp)_2$ and $H_2O$ exposures (AB-cycle growth) corresponding to ALD growth of MgO, a well-documented process. Mass increase and decrease after the $Mg(Cp)_2$ and $H_2O$ exposures were ~40 ng/cm² and ~8 ng/cm², respectively. The net MGPC was ~32 ng/cm²/cycle and, when calculated with respect to the bulk density of MgO (3.58 g/cm³), resulted in a growth rate of ~0.9 Å/cycle, which is ~0.3 Å/cycle lower than expected when comparing to the $Mg(CpEt)_2$-based process of Burton et al.

Figure 3E:
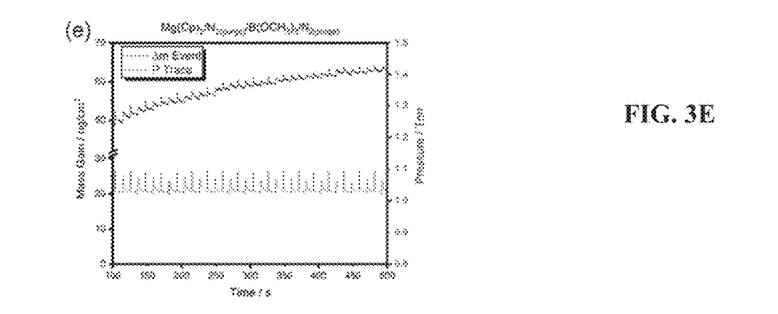

FIG. 3E shows the very slow linear growth behavior in the case wherein $Mg(Cp)_2$ and $B(OCH_3)_3$ (AC-cycle growth) exposures were used, resulting in a net MGPC of ~2.8 ng/cm²/cycle. Overall growth rates of ~0.08 Å/cycle and ~0.1 Å/cycle on the basis of MgO and $B_2O_3$ bulk densities, respectively. The very low growth rates in this case can be attributed to the relative inertness of Mg—Cp* surface site (after the $Mg(Cp)_2$ exposure) compared to the Mg—OH* surface sites that form when the $H_2O$ dose follows the $Mg(Cp)_2$ dose (AB-cycle and/or ABC-cycle growth; Method 1). In this AC-cycle growth case, the $B(OCH_3)_3$ must instead associate through a Mg—Cp* surface moiety or undergo expected chemisorption on any residual Mg—OH* that might be present on the QCM crystal. It is likely that $B(OCH_3)_3$ would be a poorer oxidizer of the metal-carbon bonds in the $Mg(Cp)_2$ when compared to $H_2O$ since the formation of Mg—B—O segments would occur kinetically slower than formation of Mg—O/Mg—OH segments during ALD growth of MgO (AB-cycle growth). It is believed that the resultant films of an AC-cycle growth would be similar to the Method 1 case (ABC-type) wherein Mg—B—O segments are forming (described later via in-situ FTIR studies) but with heavy carbon contamination due to the presence of residual surface-bound Cp ligands (as MgOMgCp* below where "*" denotes surface species) and/or adsorbed methoxy ($OCH_3$) moieties. Possible self-limiting surface reactions for the ABC-type process (Method 1) are presented below, with two possible surface reactions (each denoted with subscripts "1" or "2") for each ALD half-cycle.

$$MgOH^* + Mg(Cp)_2 \rightarrow MgOMgCp^* + HCp \tag{$A_1$}$$

$$2MgOH^* + Mg(Cp)_2 \rightarrow MgOMgOMg^* + 2(HCp) \tag{$A_2$}$$

$$MgOMgCp^* + H_2O \rightarrow MgOMgOH^* + HCp \tag{$B_1$}$$

$$(MgO)_2Mg^* + H_2O \rightarrow (MgO)_2MgOH^* + MgOH^* \tag{$B_2$}$$

$$MgOMgOH^* + B(OCH_3)_3 \rightarrow MgOMgBO^* + (HOCH_3)_3 \tag{$C_1$}$$

$$MgOMgOH^* + B(OCH_3)_3 \rightarrow MgOMgB^* + (OCH_3)_2 + CH_4 \tag{$C_2$}$$

Two possible self-limiting surface reactions are proposed for each ALD half-cycle in the $Mg(Cp)_2$—$H_2O$—$B(OCH_3)_3$ reaction sequence. During the $Mg(Cp)_2$ exposure, the chemisorption can occur such that one ($A_1$) or two ($A_2$) reactive MgOH* sites may be consumed by the $Mg(Cp)_2$ precursor to evolve either one or two protonated Cp ligands (HCp*). The first pathway ($A_1$) generates a surface-reactive MgCp* site, and the second pathway ($A_2$) generates a surface-reactive Mg* site for the next ALD half-cycle. In reaction $B_1$, during the $H_2O$ exposure, the single reactive MgOH* sites consumed in $A_1$ are regenerated via evolution of the HCp surface; similarly, in reaction $B_2$, both MgOH* are regenerated via dissociative adsorption of the $H_2O$. In the final half-cycle, during the B(OCH$_3$)$_3$ exposure, it is likely that the reaction through the OCH$_3$ groups and MgOH* in both C$_1$ and C$_2$ can either generate methanol (HOCH$_3$) byproducts (C$_1$) or methane (CH$_4$) as well as volatile OCH$_3$ moieties (C$_2$) in the gas phase. In-situ FTIR spectroscopy measurements of the ABC reaction sequence were undertaken to confirm the self-limiting surface ALD reactions and further elucidate the proposed surface reaction mechanisms.

Figure 4A:
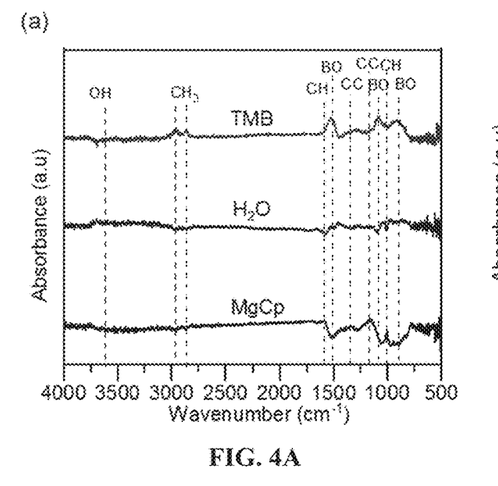
FIGS. 4A-4B show in-situ Fourier-transform infrared ("FTIR") spectroscopy difference spectra for each ALD half-cycle step in a single ABC super-cycle for Method 1 ($Mg(Cp)_2$-$H_2O$—$B(OCH_3)_3$) (FIG. 4A) and resulting FTIR spectra for the first 50 ABC cycles acquired after every 5-10 ABC ALD super-cycles (FIG. 4B). In-situ FTIR performed at 200° C. on $ZrO_2$ high-surface area nanopowder dispersed into a steel mesh substrate. Spectra in FIGS. 4A-4B have been background subtracted, and each half-cycle in spectrum were recorded after precursor exposure and purging (ultra-high purity ("UHP") $N_2$) of the FTIR cell.

FIG. 4A shows the in-situ FTIR vibrational difference spectra with peak assignments labeled (also summarized in Table 1) of a single Mg(Cp)$_2$—H$_2$O—B(OCH$_3$)$_3$ pulse sequence (ABC cycle; Method 1). Upon exposure of the Mg(Cp)$_2$ there is a concomitant loss of absorbance in the B—O stretches at 1513, 1080, and 897 cm$^{-1}$ from the previous dose and an increase of absorbance in the peaks associated with the C—C and C—H stretching/deformations of the Cp ligand (1593, 1344, 1167 cm$^{-1}$). The Mg(Cp)$_2$ does not completely remove the B—O associated stretch at ~1513 cm$^{-1}$ but removes the other two modes at 1080 and 897 cm$^{-1}$, which might indicate that mechanisms C$_1$ and C$_2$ are taking place simultaneously such that Mg—B—O* and Mg—B* surface species are forming. The following H$_2$O exposure results in the removal of all the Cp-related C—C and C—H surface moieties and the appearance of an OH absorbance at ~3617 cm$^{-1}$, which suggests that both of the proposed self-limiting surface reactions in B$_1$ and B$_2$ are possible. Expectedly, a loss in absorbance for the OH mode occurs after the B(OCH$_3$)$_3$ exposure with the simultaneous reappearance of the B—O associated stretches indicating the Mg—B—O* and possibly oxygen deficient Mg—B* surface sites are regenerated for the following (Mg(Cp)$_2$) ALD half-cycle. The FTIR assignments are summarized below in Table 1.

Figure 4B:
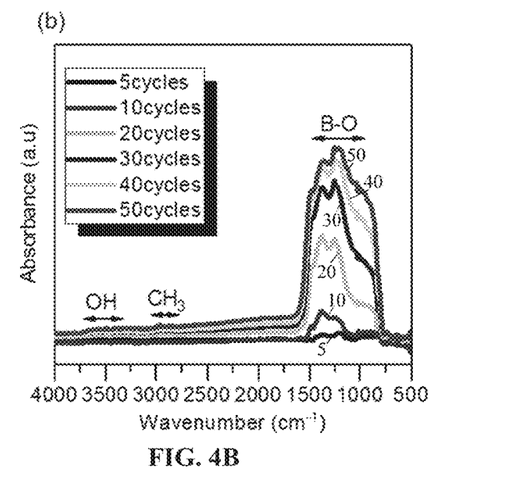

FIG. 4B shows the vibrational modes for the bulk Mg—B—O material from 5 to 50 ABC-type ALD cycles for Method 1 at 200° C. B—O related modes increase as a function of the ALD cycles with a notable increase in the shoulder peak ~912-890 cm$^{-1}$ indicating formation BO$_3$/B$_2$O$_3$ units. This also verifies that the Mg(Cp)$_2$ exposure is required to stabilize any growth of B$_2$O$_3$, otherwise (without Mg(Cp)$_2$ dose) the BC-cycle exposures showed non-linear growth behavior in the QCM studies (FIG. 3D). In summary, the formation of the Mg—B—O units as observed by the in-situ FTIR studies results in both oxygen-rich MgB$_2$ and B$_x$Mg$_{1-x}$O materials, which were confirmed by the XPS analysis (FIG. 2A).

TABLE 1

Vibrational frequency data obtained from the in-situ FTIR difference spectra (FIG. 4A) after each exposure (half-cycle) in a single ABC-cycle, as well as after 50 total ALD cycles (FIG. 4B) in Method 1.

| Frequency/Wavenumber (cm$^{-1}$) | (Ligand) Peak Assignment |
|---|---|
| 3617 | OH Stretch |
| 2951 | (BOCH$_3$)$_3$ CH$_3$ Antisymmetric Stretch |
| 2851 | (BOCH$_3$)$_3$ CH$_3$ Antisymmetric Stretch |
| 1593 | (Cp) CH Symmetric Deformation |
| 1513 | (BOCH$_3$)$_3$ B—O Symmetric Stretch |
| 1344 | (Cp) C—C Stretch |
| 1167 | (Cp) C—C Stretch |
| 1080 | (BOCH$_3$)$_3$ B—O Asymmetric Stretch |
| 1008 | (H—Cp) C—H Deformation |
| 897 | B—O Stretch |

Figures 5A, 5B:
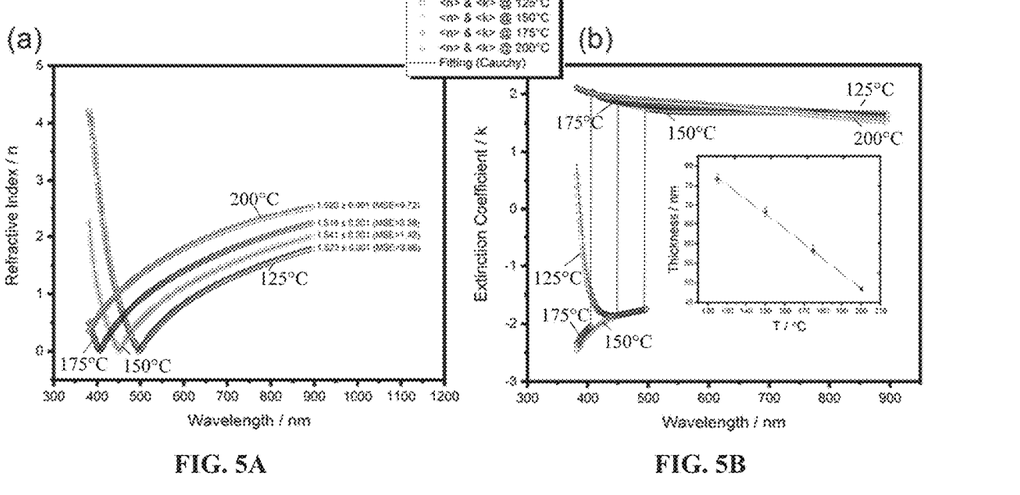
FIGS. 5A-5B show spectroscopic ellipsometry-derived refractive index (n) (FIG. 5A) and extinction coefficient (k) (FIG. 5B) as a function of wavelength for the as-deposited $B_{1-x}Mg_xO_y$ films on Si(100) for Method 1 in the 125-200° C. temperature range. Data was fit using the Cauchy model for oxides on Si, and resultant refractive indices (at 632 nm) are indicated at the trace tails. The inset of FIG. 5B is the SE-derived thickness data for the films at the various growth temperatures. Thickness determinations were the average thickness of samples situated at the front, middle, back positions of the ALD reactor tube (error bars indicate precision error).
Figure 6A:
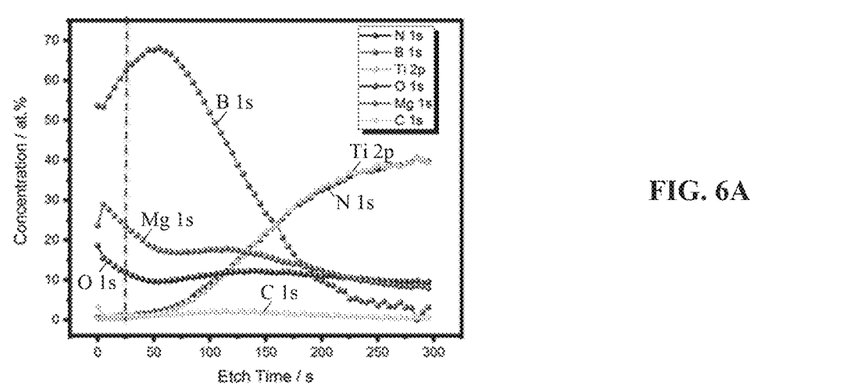
Figure 6B:
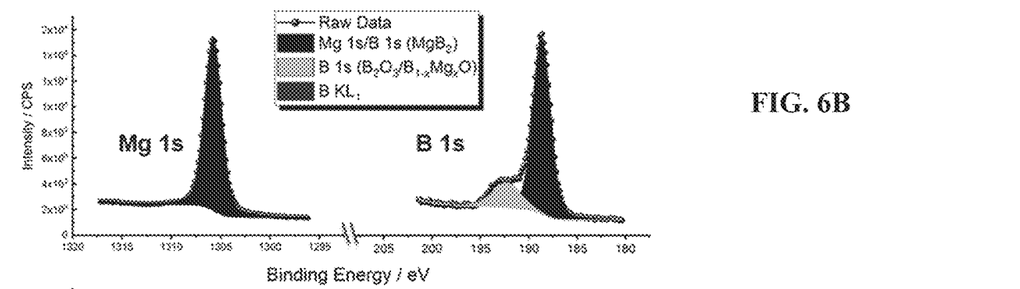
Figure 6C:
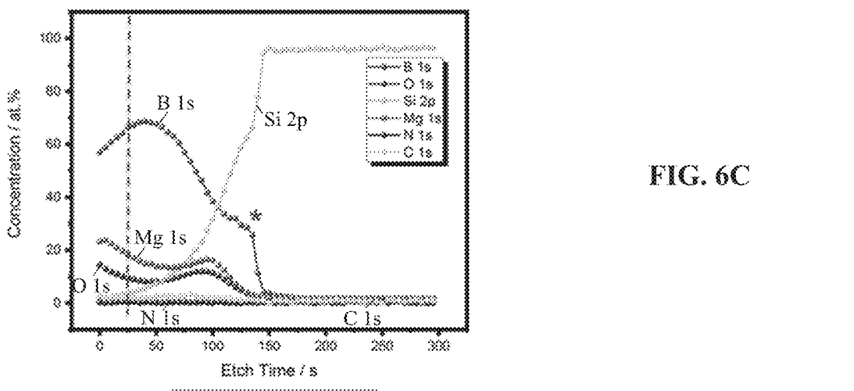
Figure 6D:
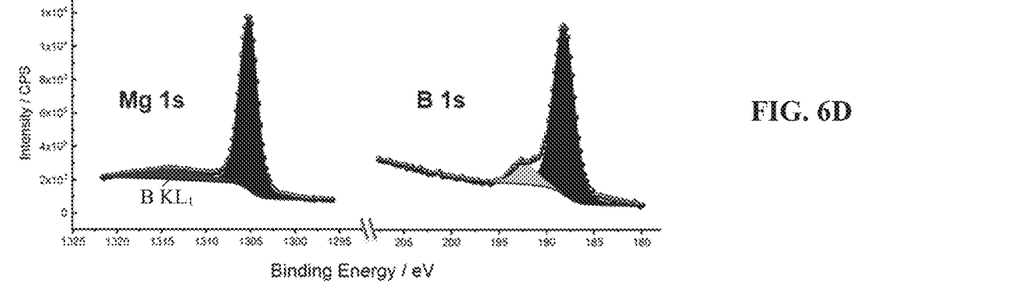

The temperature-dependent GPC data for Method 1 (with 1.5-10-1-10-1-10 s; 1000 cycles) was obtained in the 125-200° C. temperature window (inset of FIG. 5B) based on film thicknesses obtained using spectroscopic ellipsometry ("SE"). The linear fit of this plot yields a GPC of ~0.38±0.01 Å/cycle, which is similar to the GPC obtained for B$_2$O$_3$ films grown thermally using B(OCH$_3$)$_3$ with O$_3$ or by plasma-enhanced ALD using O$_2$. The refractive indices (n) and extinction coefficients (k) were modeled using the simple Cauchy to represent the dielectric layer on Si (native SiO$_2$ thickness fixed to 1.6 nm). Attempts to fit the spectra to homogeneous optical properties of MgO or B$_2$O$_3$ results in mean-square error ("MSE") values >10. Resultant refractive indices (FIG. 5A) were therefore fit to a dummy cauchy layer, which yields n values in the range of ~1.50-1.52 for ALD temperatures of 125-200° C. These values are in closer agreement to the refractive index for B$_2$O$_3$ (1.46) than bulk MgO (1.73). Interestingly, there is a sharp temperature-dependent transition between ~400-500 nm in the n and k plots, which could indicate the σ→π interband transition observed for MgB$_2$. Ellipsometric modeling of this σ→π transition, which occurs in the 400-500 nm range (3.1-2.5 eV), is currently under investigation, but this confirms a dielectric material composed of both MgB$_2$ and B$_{1-x}$Mg$_x$O$_y$.

Figure 11:
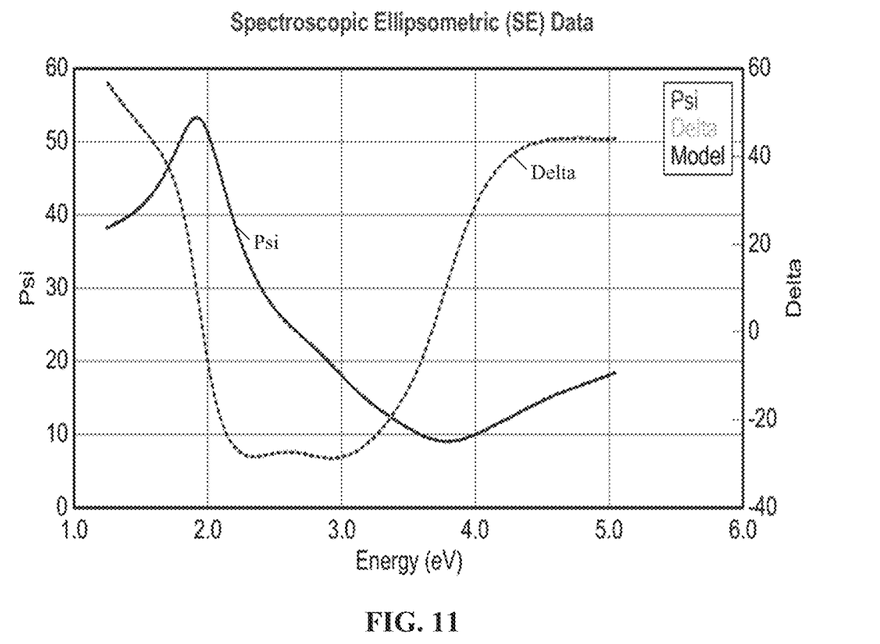
FIG. 11 shows ellipsometry data for the 3400 cy film just grown on Si (semiconductive), TiN/Si(100) (conductive), and $SiO_2$ (insulating).

In the second embodiment (Method 2), pulsed-CVD is used. In this context, pulsed CVD from a single-source precursor (i.e., the precursor contains the metal and heteroatom—B in this case—of the target film) is employed herein. Unlike ALD, where separate half-cycle steps are employed, the p-CVD process just involves careful decomposition into the MgB$_2$ films from a single molecule. This could be seen as a significant advantage in processes where scale-up (e.g., cavity coatings) is required. Similar to the above comments, UHP is 99.999% and UHP argon OR nitrogen (or any inert gas) are suitable as carrier gases herein. Bis(N,N-dimethyldiboranamido)magnesium(II) (Mg(H$_3$BNMe$_2$BH$_3$)$_2$) or Mg(DMADB)$_2$) are utilized as precursors. with intermittent purge cycles using UHP Ar. The CVD takes place at a reaction temperature in the range of, in one embodiment 250-290° C. and optimal growth temperature of 290° C. Mg(DMADB)$_2$ bubbler temperature was ~41° C., and due to its very high vapor pressure (~0.8 Torr at 25° C.), a 100 μm orifice was installed on the bubbler dose valve to avoid precursor over-dosing and for precursor conservation (only 0.5 g of the white solid was available). In one embodiment, bubbler temperatures ranging from 24-45° C. can be employed to encourage volatilization and such as ~41° C. with 100 μm orifice inserted. Smaller orifice apertures (30-75 μm) can also be used and therefore slightly elevated bubbler temperatures ~45° C. are recommended to maintain the growth per cycle (~0.13 Å/cycle by ellipsometry/QCM). FIG. 11 shows data with thicknesses for method 2 (3400 cycles) on SiO2, Si, and TiN/Si substrates. According to the recorded thicknesses, the growth per cycle is in the 0.13-0.25 Å/cycle range). Superconductivity (T$_c$~20-25° K) was observed for 1000 cy (~13.1 nm).

The p-CVD pulse sequence (in seconds), t$_1$-t$_2$, where t$_1$ were is the time for the Mg(DMADB)$_2$ pulse having a range of at least 1 second (in one embodiment, 1.25 s) and t$_2$ is the ultra-high purity Ar purge time of at least 15 seconds (in one embodiment, 20 s).

FIGS. 6A-6D depict the XPS depth profile and HR-XPS analysis of films deposited via Method 2 on TiN and Si(100) substrates, simultaneously using the Mg(H$_3$BNMe$_2$BH$_3$)$_2$ (hereafter referred to as "Mg(DMADB)$_2$") precursor as both the Mg and B source. It should first be noted that the as-deposited films (0 Ar$^+$ etch cycles) contained trace amounts of carbon (<5 at. %) due to exposure of the films to the ambient after deposition. No C 1 s signal is detected after Ar$^+$ etch cycles were applied (FIGS. 6A and 6C), indicating that decomposition of the DMADB ligand during the p-CVD process did not occur. HR-XPS spectra were extracted from a bulk region of the film (dashed lines in FIGS. 6A and 6C) and had a total stoichiometry corresponding to MgB$_{2.6}$O$_{0.5}$. Unlike Method 1, oxygen concentration throughout the bulk of the films was a much lower, ~10 atomic percent on TiN/Si(100) substrates and as low as 5 at. % on the Si(100) substrate, and in both cases is attributed to room-temperature oxidation of MgB$_2$. The MgB$_2$ are effectively B-rich based on the total stoichiometry from the depth profile; however, the B is HR-XPS (FIGS. 6B and 6D) indicates the presence of minor B$_2$O$_3$ components at ~193 eV, which would reduce the Mg/B ratio from 2.6 to a value closer to 2 for stoichiometric MgB$_2$. The major binding energy components for the Mg 1 s and B 1 s sub-shells found at 1305 eV and 187-187.5 eV, respectively, correspond to MgB$_2$. The MgB$_2$ film deposited onto the Si(100) is slightly more metallic due to screening from Mg—Mg bonding and highly delocalized electrons originating from the B 2p$_z$ orbitals and causing conductivity along MgB$_2$ basal planes and screening of the Mg-based core holes such as the Mg 1 s photoelectrons.

It was observed that the adhesion of the MgB$_2$ is similar on the Si(100) and TiN/Si(100) whereas the thickness is slightly lower SiO$_2$ or insulating substrates in general. Sample material was deposited on Cu substrates as well but thickness can't be extracted by ellipsometry, but it is expected that a similar film adhesion/sticking coefficient of the films on metallic/semiconducting substrates. The higher electron density of the metallic substrates might play a role in reducing the Mg(DMADB)$_2$ precursor to MgB$_2$ after chemisorption at 290° C. compared to an oxygen-rich insulating substrate such as the fused silica (SiO$_2$). FIG. 11 and Table 2 below present ellipsometry data for the 3400 cy film just grown on Si (semiconductive), TiN/Si(100) (conductive), and SiO$_2$ (insulating).

TABLE 2

| Fit Results | Optical Model |
| --- | --- |
| MSE = 1.903 | Roughness = 2.43 nm |
| Thickness #2 = | Layer #2 = B-Spline Thickness |
| 49.65 ± 0.372 nm | #2 = 49.65 nm (fit) |
| n of TiN 1 @ 1.960 | Layer #1 = TiN 1 Thickness #1 = |
| eV = 1.66874 | 150.00 nm |
| k of TiN 1 @ 1.960 | Substrate = SI_JAW |
| eV = 1.67608 | |

It is currently believed that the delocalized B KL$_1$ peak (shaded red in FIG. 6D) to this phenomenon. The MgB$_2$ films have slightly better adhesion to the TiN/Si(100) compared to the Si(100) on the basis of Si 2p signals arising after ~31 s of Ar$^+$ etching (~6 etch cycles) compared to Ti 2p signal arising ~65 s (~13 etch cycles). However, extracting thicknesses by SE on the MgB$_2$—TiN/Si(100) film is challenging due to the metallic nature of the overlayer and TiN, and the effective etch rate of the films using Ar$^+$ bombardment is calibrated based on Ta$_2$O$_5$ films. Additionally, the interface of the MgB$_2$—Si(100) film (FIG. 6C) is much more abrupt compared to the diffuse MgB$_2$—TiN/Si(100) which appears to form embedded MgO (preferential sputtering of B) in the TiN layer.

Figure 7:
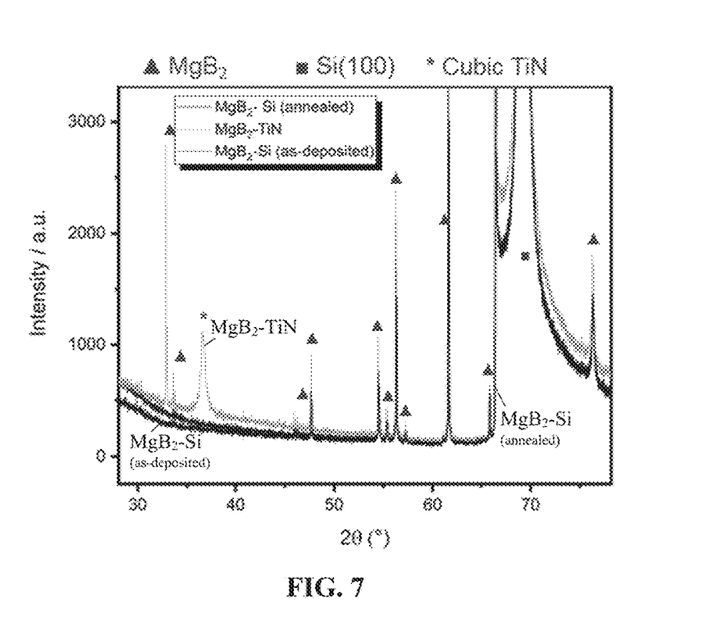
FIG. 7 shows X-ray diffraction patterns of the $MgB_2$ films from Method 2 (pulsed chemical vapor deposition ("p-CVD")) on Si(100) before and after annealing, as well as as-deposited on TiN substrate (150 nm TiN on Si(100)). TiN is epitaxial with the exception of the TiN (cubic) peak at 36.5° C.
Figure 8A:
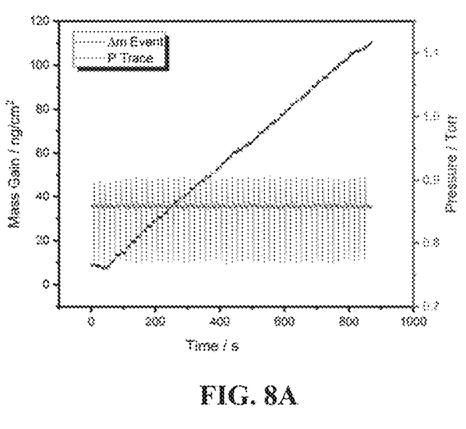
FIGS. 8A-8B show QCM monitoring for Method 2 (p-CVD of the $(Mg(H_3BNMe_2BH_3)_2$ precursor) (FIG. 8A) with a zoomed view of 6 p-CVD cycles (FIG. 8B). Note: 1.25-20 s $Mg(H_3BNMe_2BH_3)_2$— Purge (UHP Ar) sequence was used ($T_{reactor}$=290° C.).
Figure 8B:
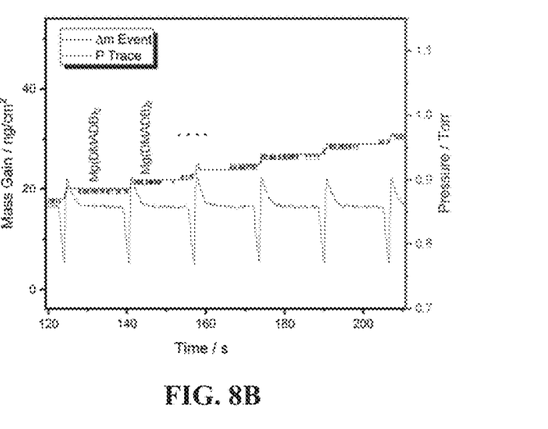

X-ray diffraction ("XRD") patterns (FIG. 7) indicated crystalline MgB$_2$ for the as-deposited films on Si(100) and TiN/Si(100) substrates as well as crystalline MgB$_2$ after annealing at 400° C. in Ar/H$_2$ (5% H$_2$) for 10 min. The diffraction peaks assigned are in agreement with the literature, and there may be overlapping t-Mg$_2$B$_2$O$_5$ phases (not shown is a small peak ~80° related to a minor MgO phase). A diffraction peak corresponding to MgB$_2$ (100) is found at . %. FIG. 8 shows the linear growth behavior for the p-CVD growth of MgB$_2$ from Mg(DMADB)$_2$ using 1.25-20 s sequence (Mg(DMADB$_2$)-UHP Ar Purge) by QCM at 290° C. over ~40 cycles. The MGPC was ~3.2 ng/cm$^2$, and assuming bulk density of MgB$_2$ (2.57 g/cm$^3$), this means the GPC was ~0.12 Å/cycle. This GPC is in agreement with the thickness of MgB$_2$—Si(100) film obtained from SE, which was 13.1 nm for 1000 p-CVD cycles. Other QCM studies in which the purge time is lower than 15 s (not shown) resulted in no growth, suggesting that the MgB$_2$ film growth is kinetically slow due to the thermolysis of the bulky, sterically encumbered DMADB ligand. Saturating growth behavior of the films was obtained for Mg(DMADB)$_2$ pulse times >1 s and purge times >15 s. It is worth noting that in-line quadrupole mass spectrometry studies (not shown in this summary) were used initially to confirm that the DMADB ligand was not decomposing into the volatile and toxic B$_2$H$_6$ after each p-CVD cycle.

Figure 9A:
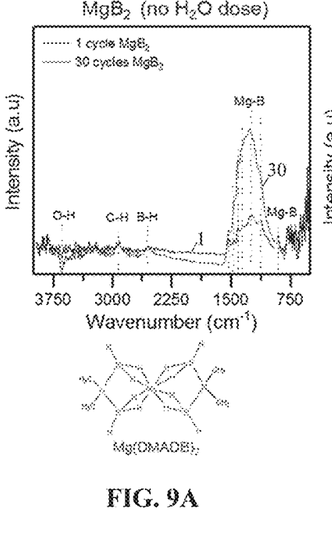
FIG. 9A shows in-situ FTIR spectra obtained after 1 and 30 p-CVD (Method 2) cycles of the $Mg(H_3BNMe_2BH_3)_2$ precursor (structure shown below and denoted as "Mg(DMADB)$_2$").
Figure 9B:
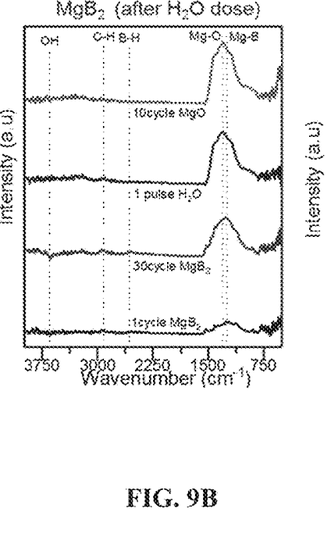
FIG. 9B shows in-situ FTIR spectra after dosing with $H_2O$ after the first 30 p-CVD cycles where only the $Mg(H_3BNMe_2BH_3)_2$ precursor was dosed and after 10 AB cycles (A: $Mg(H_3BNMe_2BH_3)_2$, B: $H_2O$) to generate MgO.
Figure 9C:
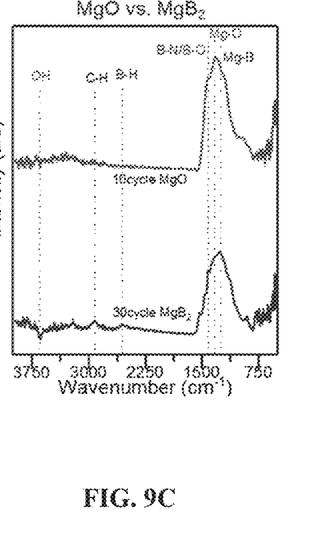
FIG. 9C shows FTIR spectral overlay comparing $MgB_2$ (30 cycles) from Method 2 to co-dosing of $Mg(H_3BNMe_2BH_3)_2$ with $H_2O$ (10 cycles, forming MgO).

Follow-up in-situ FTIR studies of the first 30 cycles of the p-CVD process for Mg(DMADB)$_2$ at 290° C. were undertaken and are shown in FIGS. 9A-9C. Numerous absorbances in the 1300-1500 cm$^{-1}$ range are assigned to MgB$_2$ related vibrational modes with the broadband envelope which can be decomposed into noticeable peaks ~1040, 1440, and 1630 cm$^{-1}$ (dashed lines in FIG. 9A), which correspond to multiples of a lower energy absorption band at 485 cm$^{-1}$ (not seen here due to overlap of ZrO$_2$ NP substrate background at energies <700 cm$^{-1}$ and the instrument resolution) consistent with bulk MgB$_2$. The first exposure of the Mg(DMADB)$_2$ also results in the appearance of B—H, B—N, C—H, and B—O absorbances (labeled in FIG. 9A) without significant decrease of the OH absorption, which means the first dose does not completely saturate the surface, but this might be due to the high-surface area of the ZrO$_2$ nanopowder having a higher OH density compared to the planar substrate wafers used in normal film synthesis. However, the OH signal is completely reduced after 30 p-CVD cycles of the Mg(DMADB)$_2$ which could explain the non-zero oxygen concentration in the films as determined by HR-XPS analysis (~5-10 at. %). Additionally, there is an associated increase in the B—H and C—H vibrational modes with increasing Mg(DMADB)$_2$ exposures, which suggests very minor decomposition of the DMADB ligand, which has been observed for this precursor at T<300° C. and especially in the presence of residual oxygen.

Interestingly, when immediately dosing with a single H$_2$O exposure after the 30 Mg(DMABD)$_2$ p-CVD cycles (FIG. 9B) a shift of the dominant peak envelope for the MgB$_2$ to higher wavenumbers occurs and is attributed to the longer bond length of the MgO (2.5 Å) compared to the MgB$_2$ (1.8 Å). This was solely for comparison to the known Mg(DMADB)2+H$_2$O process for MgO films. For comparison purposes, a dose with H2O was performed the end of the in-situ FTIR measurements for method 2 (just the Mg(DMADB)$_2$ precursor) to reveal changes in the FTIR peak envelope where transitions from Mg—B related peaks to Mg—O—B or Mg—OH environments are expected to occur. Quenching is seen of the Mg—B related IR modes upon further oxidation of this layer. This was solely for comparison and was done to allow "fingerprinting" the FTIR region for the Mg(DMADB)$_2$ p-CVD exposures and how they change when MgO begins to form. In addition to the expected appearance of the broad OH band, there is a simultaneous attenuation of the C—H absorbance and disappearance of the B—H absorbance. After 10 alternating cycles of the Mg(DMADB)$_2$ and H$_2$O, which is itself a process used previously for the CVD of highly conformal MgO films, disappearance of the C—H absorbance arising from the DMADB ligand is confirmed. A direct comparison of the 10-cycle MgO CVD surface to the 30-cycle MgB$_2$ CVD (Method 2) surface shows the absence of main B—O, Mg—O and OH contributions in the former (green trace; FIG. 9C) and the absence of B—H, B—N absorbances associated with the latter process (red trace; FIG. 9C). Finally, there is an attenuation of the MgB$_2$ related absorbance ~1080 cm$^{-1}$ in the 10-cycle MgO case and a peak ~1418 cm$^{-1}$ that can be attributed to either residual B—O surface species from the Mg(DMADB)$_2$ p-CVD process which formed a BO$_3$ unit or similar.

Figure 10:
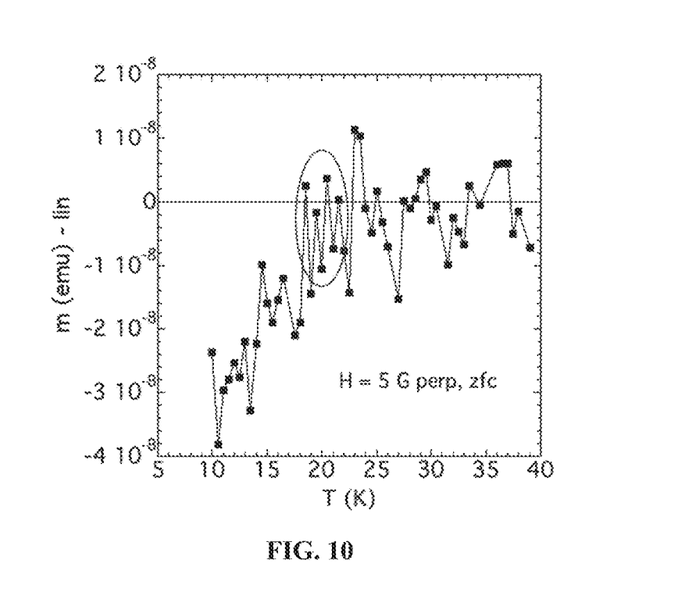
FIG. 10 shows temperature-dependent magnetization of as-deposited $MgB_2$ on Si(100) from Method 2 (p-CVD using $Mg(DMADB)_2$) under constant applied magnetic field of 5 Oe. Encircled region indicates a $T_c$ of ~20° K for the $MgB_2$. Note: the applied magnetic field was perpendicular to the mounted $MgB_2$ film/Si(100) substrate.

FIG. 10 shows the temperature-dependent magnetization of the MgB$_2$—Si(100) sample using a SQUID magnetometer at 5Oe (=G) field. The critical superconducting transition temperature (T$_c$) is defined by the sharp (10$^8$ a.u.) decrease in magnetic moment as a function of temperature. The paramagnetic instead of diamagnetic response of this film may have arose due a variety of factors since the measured magnetic moment is the sum of various contributions: the film, the substrate, the sample holder, and the sample is both granular (crystalline by XRD) and thin (13.1 nm by SE). T$_c$ was observed in the range of 20-25° K, which is relatively higher than expected given the non-zero oxygen concentration and B-rich nature of the films as confirmed by HR-XPS, as well as presence of grain boundaries due to the confirmed MgB$_2$ film crystallinity. There is only one other report using Mg(DMADB)$_2$ to synthesize superconducting MgB$_2$ thin films; however, this process incorporates the Ti analogue of the Mg(DMADB)$_2$ precursor (Ti(H$_3$BNMe$_2$BH$_3$)$_2$) as a catalytic co-reagent to accelerate the surface reaction rate of the Mg(DMADB)$_2$ precursor (at T>300° C. for best performing films), and results in highly impure Ti-doped MgB$_2$ films (Mg$_{0.8}$Ti$_{0.2}$B$_2$) that are non-superconducting above 4 K. The present methods observe improvement of the growth rate of the MgB$_2$ films without the use of catalytic seed surfaces (Ti) or co-reagents (Ti (DMADB)$_2$) by increasing the length of the purge step between Mg(DMADB)$_2$ doses, resulting in phase pure MgB$_2$ with 5-10 atomic % oxygen impurity and T$_c$ well above 4 K. The processes described herein use the Mg(DMABD)$_2$ precursor as the sole reactant for the fabrication of the MgB$_2$ films and without the need for Ti seed layers or the Ti(DMADB)$_2$ catalytic co-reagent employed in prior work. Moreover, unlike the prior work, the optimal growth temperature is also <300° C. Most critically, prior work on MgB$_2$ films did not result in the nearly pure MgB$_2$ described herein, but rather impure (20% Ti). This results in the prior art materials lacking the observed superconducting (20-25 K) of the materials described herein.

In processes for both intimate mixture films of MgB$_2$/B$_x$Mg$_{1-x}$O (Method 1) and pure MgB$_2$ (Method 2) represent substantial progress for synthesis of MgB$_2$ at temperatures <300° C. without the use of B$_2$H$_6$ or halogenated precursors, which tend to yield B-rich or Mg-depleted MgB$_2$ with high surface resistances. Moreover, substitutional replacement of the B atoms with larger, more polarizable heteroatoms such as F, Cl, or O in the case of halogenated Mg precursors can dwarf the superconducting properties of the MgB$_2$. The method described herein achieved superconducting MgB$_2$ films and with further suppression of the oxygen concentration and crystallinity, the T$_c$ can be further enhanced to its bulk value of 39° K. Avoiding air exposure post-deposition and in between characterization measurements would be desirable in avoiding partial oxidation of MgB$_2$ as it is a relatively oxophilic material.

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

Ultra High Purity (UHP) as used herein indicates 99.999% purity of the carrier gas and <0.001% other gas content.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

What is claimed is:
1. A method for forming a MgB$_2$ containing film comprising:
   depositing a coating on a substrate via layer atomic layer deposition by X, where X is greater than 0, cycles of the steps of:
      pulsing, for 0.75 to 5 seconds, a first precursor comprising Bis(cyclopentadienyl) Magnesium (II) (Mg(Cp)$_2$) at a first deposition temperature;
      purging, 10 to 30 seconds, the first precursor;

pulsing, for 0.5 to 5 seconds, a second precursor comprising an oxidizer of the first precursor at a second deposition temperature;

purging , for 10 to 30 seconds, the second precursor; and pulsing, for 0. 5 to 1 seconds, a third precursor comprising Trimethyl borate ($B(OCH_3)_3$) at a third deposition temperature, and annealing, at a temperature below 450° C. the deposited coating in a reducing environment to remove oxygen from the film.

2. The method of claim 1, wherein purging the first precursor and purging the second precursor both comprise ultra high purity nitrogen exposure.

3. The method of claim 1, wherein the first precursor is pulsed via a carrier gas passed through a bubbler comprising liquid ($Mg(Cp)_2$).

4. The method of claim 1, wherein the liquid ($Mg(Cp)_2$ is at a temperature of at least 70° C.

5. The method of claim 1, wherein the liquid ($Mg(Cp)_2$ is at a temperature of about least 80° C.

6. The method of claim 1, wherein the first reaction temperature, the second reaction temperature, and the third reaction temperature are from 125° C. to 250° C.

7. The method of claim 1, wherein the annealing is in a 100% hydrogen plasma environment for 1 hour.

8. The method of claim 1 wherein the $MgB_2$ containing film comprises $MgB_2$ and $B_xMg_{1-x}O$.

9. A method for forming a $MgB_2$-containing film comprising:

depositing a coating on a substrate via layer chemical vapor deposition by the steps of:

reacting decomposing, at a reaction temperature of 250° C. to 290° C., a vaporous first precursor pulse of at least 1 second comprising ($Mg(H_3BNMe_2BH_3)_2$), forming a solid $MgB)_2$,film on the substrate; and applying a purge by a pulse of at least 15 seconds with ultra-high purity inert gas, removing the first precursor.

10. The method of claim 9, wherein the chemical vapor deposition is pulsed chemical vapor deposition comprising a plurality of cycles, each cycle comprising pulsing of the vaporous precursor followed by application of the purge with ultra-high purity inert gas.

11. The method of claim 10, wherein the $MgB_2$-containing film is superconductive at temperatures above 20° K.

12. The method of claim 10, wherein the $MgB_2$-containing film has no more than 5-10 atomic % impurity.

13. The method of claim 9, wherein the vaporous first precursor is formed by pulsing a carrier gas passed through a bubbler comprising liquid ($Mg(H_3BNMe_2BH_3)_2$) or $Mg(DMADB)_2$).

14. The method of claim 13, wherein the liquid is at a temperature between 25° C. and 45° C.

* * * * *